(12) United States Patent
Sun et al.

(10) Patent No.: US 10,276,418 B2
(45) Date of Patent: Apr. 30, 2019

(54) SILICON WAFER PRE-ALIGNMENT DEVICE AND METHOD THEREFOR

(71) Applicant: SHANGHAI MICRO ELECTRONICS EQUIPMENT CO., LTD., Shanghai (CN)

(72) Inventors: Weiwang Sun, Shanghai (CN); Gang Wang, Shanghai (CN); Chunxia Huang, Shanghai (CN); Songli Hu, Shanghai (CN); Jie Jiang, Shanghai (CN); Ruzhan Lu, Shanghai (CN); Jiyuan Mou, Shanghai (CN)

(73) Assignee: SHANGHAI MICRO ELECTRONICS EQUIPMENT (GROUP) CO., LTD., Shanghai (CN)

(*) Notice: Subject to any disclaimer, the term of this patent is extended or adjusted under 35 U.S.C. 154(b) by 276 days.

(21) Appl. No.: 15/109,040

(22) PCT Filed: Dec. 26, 2014

(86) PCT No.: PCT/CN2014/095105
§ 371 (c)(1),
(2) Date: Jun. 29, 2016

(87) PCT Pub. No.: WO2015/101220
PCT Pub. Date: Jul. 9, 2015

(65) Prior Publication Data
US 2016/0329229 A1 Nov. 10, 2016

(30) Foreign Application Priority Data
Dec. 31, 2013 (CN) .......................... 2013 1 0752191
Jul. 29, 2014 (CN) .......................... 2014 1 0367501

(51) Int. Cl.
*H01L 21/67* (2006.01)
*H01L 21/68* (2006.01)
(Continued)

(52) U.S. Cl.
CPC ........ *H01L 21/681* (2013.01); *H01L 21/6838* (2013.01); *H01L 21/68764* (2013.01);
(Continued)

(58) Field of Classification Search
CPC ................................................ H01L 21/67201
(Continued)

(56) References Cited

U.S. PATENT DOCUMENTS

| 7,746,482 B2 | 6/2010 | Graf et al. |
| 2008/0187413 A1* | 8/2008 | Kondoh ............ H01L 21/67748 414/217 |
| 2012/0268585 A1 | 10/2012 | Markwort et al. |

FOREIGN PATENT DOCUMENTS

| CN | 2002313887 A | 10/2002 |
| CN | 1787200 A | 6/2006 |

(Continued)

*Primary Examiner* — Saul Rodriguez
*Assistant Examiner* — Willie Berry, Jr.
(74) *Attorney, Agent, or Firm* — Muncy, Geissler, Olds & Lowe, P.C.

(57) ABSTRACT

A wafer pre-alignment device is disclosed, including a first unit configured to drive a wafer to rotate or move upward or downward, a second unit configured to drive the wafer to translate, and a position detector including a light source, a lens and an image sensor. A light beam from the light source passes through the wafer and the lens and thereby provides information indicating a position of the wafer to the image sensor. The first unit and the second unit are able to adjust the position of the wafer based on the information obtained by the image sensor. A method for pre-aligning a TSV wafer is also disclosed.

16 Claims, 9 Drawing Sheets

(51) Int. Cl.
  *H01L 21/683* (2006.01)
  *H01L 21/687* (2006.01)
  *H01L 21/66* (2006.01)
(52) U.S. Cl.
  CPC ........ *H01L 21/68785* (2013.01); *H01L 22/12* (2013.01); *H01L 22/22* (2013.01)
(58) Field of Classification Search
  USPC ........................................................ 414/217
  See application file for complete search history.

(56) References Cited

FOREIGN PATENT DOCUMENTS

| | | | |
|---|---|---|---|
| CN | 1848399 A | 10/2006 |
| CN | 101436004 A | 5/2009 |
| CN | 101783305 A | 7/2010 |
| CN | 102543808 A | 7/2012 |
| CN | 103021919 A | 4/2013 |
| CN | 103050427 A | 4/2013 |
| CN | 103219269 A | 7/2013 |
| CN | 103293867 A | 9/2013 |
| JP | S 63100723 A | 5/1988 |
| JP | H 0645226 A | 2/1994 |
| JP | H 113853 A | 1/1999 |
| JP | 2002329769 A | 11/2002 |
| JP | 2011066090 A | 3/2011 |

* cited by examiner

SILICON WAFER PRE-ALIGNMENT DEVICE AND METHOD THEREFOR

TECHNICAL FIELD

The present invention relates to the field of semiconductor equipment and, more particularly, to a wafer pre-alignment device and a method for the same.

BACKGROUND

Through-silicon vias (TSVs) are the latest cutting-edge chip-to-chip interconnection techniques for creating vertical interconnects between chips and between wafers. TSVs have a number of advantages including small package sizes, fast signal transmission and low power consumption.

Edge defects that can be found in standard wafers from TSV processes include: non-concentricity due to bonding misalignment; edge wears; presence of scribes; sputtered metal or insulating coating material on wafer surface; and wafer warpage. There are also notch defects including incomplete cuts, damage, meal or adhesive clogging or covering, presence of metal lines, etc. Due to significant morphological deteriorations of wafer notches, in production lines in the world employing the currently popular TSV packaging technology, aligners are used for the exposure of TSV wafers (notched wafers), which is accomplished based on marks for manual alignment without taking into account the notches. However, the conventional pre-alignment methods for TSV wafers are associated with a number of problems such as, for example, being low in efficiency, having a pre-alignment accuracy that is low and vulnerable to human disturbance, and not allowing automation.

Apart from the pre-alignment of TSV wafers, there are also practical needs for the positioning of wafers from various processes, such as warped wafers, ultra-thin wafer and Taiko wafers. However, as wafers from different processes pose different challenges in terms of centering and orientation, how to provide a pre-alignment device adapted to the handling of wafers from multiple processes including warped wafers, ultra-thin wafer and Taiko wafers remains an urgent task for those skilled in the art.

SUMMARY OF THE INVENTION

It is a first objective of the present invention to overcome the problems of low efficiency, a pre-alignment accuracy that is low and vulnerable to human disturbance and incapability of automated processing arising from the use of the existing TSV-wafer pre-alignment methods by providing a TSV-wafer pre-alignment device and a method therefor.

It is a second objective of the present invention to overcome the problem of the prior art where wafers from various processes cannot be handled in the same pre-alignment device by providing a wafer pre-alignment device compatible with a variety of processes and a method for this pre-alignment device.

In order to solve the above-described technical problems, the present invention provides a wafer pre-alignment device including: a first unit configured to drive a wafer to rotate or move upward or downward, the first unit includes a first chuck for retaining the wafer; a second unit configured to drive the wafer to translate relative to the first chuck; a position detector including a light source, an image sensor disposed above the first chuck, and a lens disposed under the first chuck, wherein a light beam from the light source passes through the wafer, the first chuck and the lens and thereby provides information indicating a position of the wafer relative to the first chuck on to the image sensor, wherein the first unit and the second unit are configured to adjust the position of the wafer relative to the first chuck based on the information obtained by the image sensor.

Preferably, the information includes a deviation of a center of the wafer from a center of the first chuck, and the first unit and the second unit are configured to adjust a radial position of the wafer relative to the first chuck based on the deviation.

Preferably, the first unit further includes: a rotating motor configured to drive the first chuck to rotate; and a lifting motor configured to drive the first chuck to move upward or downward.

Preferably, the second unit includes: a second chuck disposed lateral to the first chuck, wherein the lifting motor is configured to transfer the wafer between the first chuck and the second chuck; and a translating motor configured to drive the second chuck and the wafer to translate so as to adjust the radial position of the wafer relative to the first chuck.

Preferably, each of the first and second chucks includes a plurality of suction holes.

Preferably, the image sensor includes a plurality of CCDs arranged in a one-dimensional linear array, an extended line of the one-dimensional linear array passes through the center of the first chuck.

Preferably, the position detector includes a reflective optical system and/or a catadioptric optical system.

Preferably, the reflective optical system includes the light source, a first lens assembly, the image sensor and the lens, the light source serves as a first light source for producing a light beam having a first wavelength, the lens is implemented as a reflective lens for reflecting the light beam having the first wavelength, the first lens assembly is disposed above the first chuck and under the image sensor and configured to direct the light beam having the first wavelength on the wafer and the reflective lens and the light beam is then reflected onto the image sensor.

Preferably, the catadioptric optical system includes the light source, a second lens assembly, the image sensor and the lens, the light source serves as a second light source for producing a light beam having a second wavelength, the lens is implemented as a transmissive lens allowing the transmission of the light beam having the second wavelength, the second lens assembly is disposed under the first chuck and configured to cause the light beam having the second wavelength to transmit through the wafer and the transmissive lens and then reach the image sensor.

Preferably, the lens is a filtering lens configured to reflect a light beam having a first wavelength and allow transmission of a light beam having a second wavelength.

Preferably, the wafer is a TSV wafer with a notch on an edge thereof, a warped wafer, an ultra-thin wafer or a Taiko wafer, the catadioptric optical system is configured to obtain the information indicating the position of the ultra-thin wafer or the Taiko wafer relative to the first chuck, and the reflective optical system is configured to obtain the information indicating the position of the TSV wafer relative to the first chuck.

Preferably, the information further include a position of the notch with respect to the TSV wafer and a position of the notch with respect to the first chuck, and the first unit is further configured to adjust a circumferential position of the TSV wafer relative to the first chuck based on the information.

The present invention also provides a method for pre-aligning a TSV wafer using the wafer pre-alignment device as defined above, including the steps of:

Step 100) retaining the TSV wafer on the first chuck by suction and irradiating the edge of the TSV wafer with a light beam produced by the first light source;

Step 200) rotating the first chuck by 360 degrees, concurrently with the image sensor capturing an edge image of the TSV wafer retained on the first chuck and calculating a deviation of a center of the TSV wafer from the center of the first chuck;

Step 300) transferring the TSV wafer from the first unit to the second unit and moving the TSV wafer by the second unit based on the calculated deviation so as to align the center of the TSV wafer with the center of the first chuck;

Step 400) transferring the TSV wafer from the second unit back to the first unit, rotating the first chuck by 360 degrees, capturing an edge image of the TSV wafer on the first chuck and determining whether a deviation of the center of the TSV wafer from the center of the first chuck is smaller than a predetermined value by the image sensor, if yes, proceeding to Step 500 and, if not, looping back to Step 300; and Step 500) performing, by the image sensor, detailed scanning of the notch in the TSV wafer to obtain an edge image of the notch, extracting edge coordinates of the notch from the edge image of the notch, and identifying positional attributes of the notch, thereby ending an orientation process. Preferably, calculating a deviation of a center of the TSV wafer from the center of the first chuck includes:

Step 210) obtaining a two-dimensional edge image of the TSV wafer by the image sensor and extracting edge coordinates of the TSV wafer from the obtained two-dimensional edge image of the TSV wafer;

Step 220) converting the edge coordinates of the TSV wafer to coordinates in a coordinate system of the first chuck;

Step 230) determining coordinates of the center of the TSV wafer in the coordinate system of the first chuck using a method of least squares; and Step 240) calculating a difference between the coordinates of the center of the TSV wafer and coordinates of the center of the first chuck.

Preferably, in Step S210, the image sensor is a linear-array CCD image sensor which captures one-dimensional edge images of the TSV wafer, and the captured one-dimensional edge images are combined by software into the two-dimensional edge image of the TSV wafer.

Preferably, Step S200 further includes: determining a type of the TSV wafer based on the edge image of the TSV wafer and determining a light intensity for the first light source based on the determined type of the TSV wafer.

Preferably, in Step S500, the detail scanning includes the steps of:

Step 511) causing the first chuck to return to an original position with the notch in the TSV wafer situated under and counterclockwise to the image sensor;

Step 512) rotating the first chuck clockwise by an angle such that the notch in the TSV wafer completely passes by the image sensor, with the image sensor capturing one-dimensional images of the notch;

Step 513) fitting the one-dimensional images of the notch together into a two-dimensional image;

Step 514) extracting edge coordinates of the notch from the two-dimensional image and comparing the edge coordinates of the notch with the attributes of the notch, if the notch is identified, ending the orientation process and, if the notch is not identified, activating a counter and sequentially proceeding with one of Step 515, Step 516, Step 517 and Step 518 according to a number of repeated times indicated by the counter;

Step 515) causing the first chuck to return to the original position, rotating the first chuck counterclockwise by an angle that is half an arc angle of the notch, repeating Step 512 to Step 514 and, if the notch is identified, ending the orientation process;

Step 516) causing the first chuck to return to the original position, rotating the first chuck clockwise by an angle that is half the arc angle of the notch, repeating Step 512 to Step 514 and, if the notch is identified, ending the orientation process;

Step 517) increasing an light intensity, causing the first chuck to return to the original position, repeating Step 512 to Step 514 and, if the notch is identified, ending the orientation process; and Step 518) reducing the light intensity, causing the first chuck to return to the original position, repeating Step 512 to Step 514 and, if the notch is identified, ending the orientation process.

Preferably, in Step S500, the detail scanning further includes:

Step 519) after Step 514, checking the number of repeated times indicated by the counter, and if the number does not exceed a set value, sequentially proceeding with one of Step 515, Step 516, Step 517 and Step 518 and, if the number exceeds the set value, ending the orientation process and hence the pre-alignment.

Compared to the prior art, the wafer pre-alignment device and the corresponding method according to the present invention offer the advantages as follows:

1. eccentricity and deviations of a TSV wafer can be compensated for according to a light signal captured by the image sensor;

2. the problem of incapability of incapability of automatic TSV wafer handling is solved;

3. TSV wafer centering and orientation is accomplished by software which results in higher centering and orientation accuracies;

4. the problems of obtainment of excessive TSV wafer information, slow image processing and inefficient wafer edge and notch identification arising from the use of an area-array CCD image sensor is solved by using an approach in which one-dimensional images captured by a linear-array CCD image sensor are combined into a two-dimensional image; and 5. they are adapted to the pre-alignment of wafers from various processes.

In these figures: 10—glass substrate; 20—CCD image sensor; 30—pre-alignment base; 40—first unit; 41—circular chuck (first chuck); 42—base for the circular chuck; 43—rotating motor; 44—lifting motor; 45—flexible material; 46—suction holes; 50—second unit; 51—half-moon-shaped chuck (second chuck); 52—base for the half-moon-shaped chuck; 53—linear motor; 54—base for the linear motor; 60—wafer; 61—notch; 62—intersection point; 63—first side; 64—second side; 65—intersection points of the two sides; 70—reflective optical system; 71—light source; 72—lens assembly; 73—lens; 80—catadioptric optical system; 81—light source; and 82—lens assembly.

DETAILED DESCRIPTION

In order to describe the subject matter of the present invention in greater detail, specific embodiments are set forth below to demonstrate its technical benefits. It is stressed that these embodiments are provided for the purpose of illustrating the present invention, rather than limiting the scope thereof.

Embodiment 1

Figure 1:
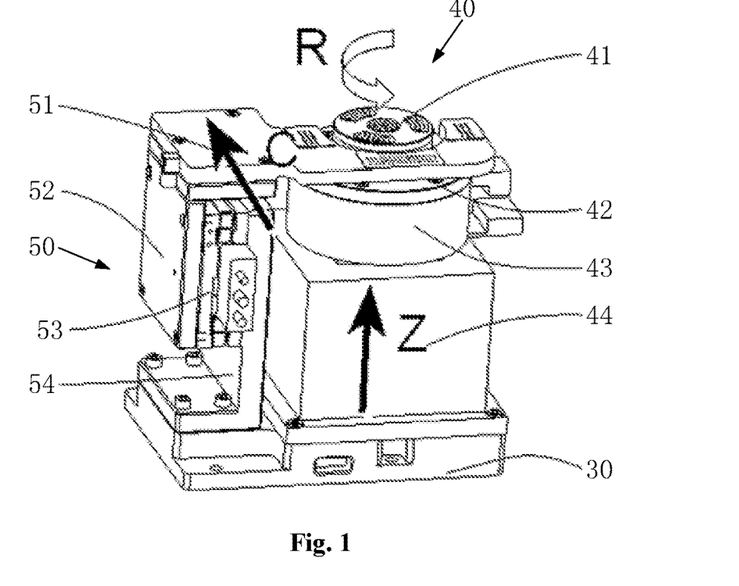
FIG. 1 is a schematic illustration of a wafer pre-alignment device in accordance with a first embodiment of the present invention.
Figure 2:
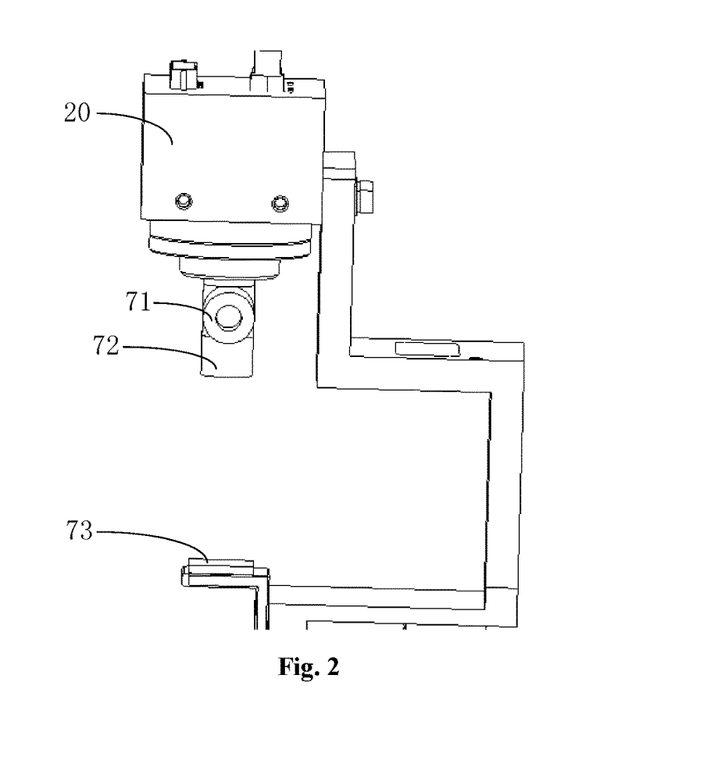
FIG. 2 is a schematic illustration of a reflective optical system in the wafer pre-alignment device in accordance with the first embodiment of the present invention.

As illustrated in FIGS. 1 and 2, a wafer pre-alignment device according to the present invention includes a reflective optical system 70, an image sensor 20 (preferably a CCD (Charge Coupled Device) image sensor), a first unit 40 and a second unit 50. The first unit 40 is configured to drive a wafer to rotate or move vertically, and the second unit 50 is configured to drive the wafer to make translational movements. The reflective optical system 70 includes a light source 71 and a lens assembly 72. Optionally, the light source 71 produces red light. The lens assembly 72 is configured to direct the light produced by the light source 71 onto a wafer 60.

A beam of the light produced by the light source 71 and reflected by the wafer 60 can be captured by the CCD image sensor 20 as an optical signal, based on which, the first unit 40 and the second unit 50 can perform adjustments in the position of the wafer 60. Taking advantage of the compensation for the position of the wafer 60 effectuated by means of the light signal captured by the image sensor, the present invention achieves an increased pre-alignment accuracy for the wafer 60, higher operational efficiency and automated processing.

Preferably, with emphasized reference to FIG. 1, the first unit 40 includes a circular chuck 41, a rotating motor 43 and a lifting motor 44. The rotating motor 43 drives the circular chuck 41 to rotate in a direction R (i.e., about a direction Z), and the lifting motor 44 lifts or lowers both the circular chuck 41 and the rotating motor 43 in the Z direction. The wafer 60 can be sucked on the circular chuck 41. The CCD image sensor 20 is configured to detect a deviation from a center of the wafer 60 to a center of the circular chuck 41 and, in case of the wafer 60 implemented as a TSV wafer, the CCD image sensor 20 also detects the position of a notch in the TSV wafer.

Preferably, with continued reference to FIG. 1, the first unit 40 further includes a base 42 for the circular chuck, and the chuck 41 is mounted on the base 42. The chuck base 42 is secured to the rotating motor 43, and the rotating motor 43 is fixed to the lifting motor 44.

Preferably, with continued reference to FIG. 1, the second unit 50 includes a half-moon-shaped chuck 51 and a linear motor 53. The half-moon-shaped chuck 51 is disposed lateral to the circular chuck 41, and the lifting motor 44 serves to transfer the wafer between the circular chuck 41 and the half-moon-shaped chuck 51. The linear motor 53 can drive the half-moon-shaped chuck 51 and the wafer 60 to translate in a direction C so as to compensate for the deviation between the center of the wafer 60 and the center of the circular chuck 41.

Preferably, with continued reference to FIG. 1, the second unit 50 further includes a base 52 for the half-moon-shaped chuck and a base 54 for the linear motor. The half-moon-shaped chuck 51 is in fixed connection with the linear motor 53 via the base 52, and the linear motor 53 is secured to a pre-alignment base 30 via the base 54.

Preferably, the first unit 40 and the second unit 50 are disposed on the pre-alignment base 30.

Figure 3:
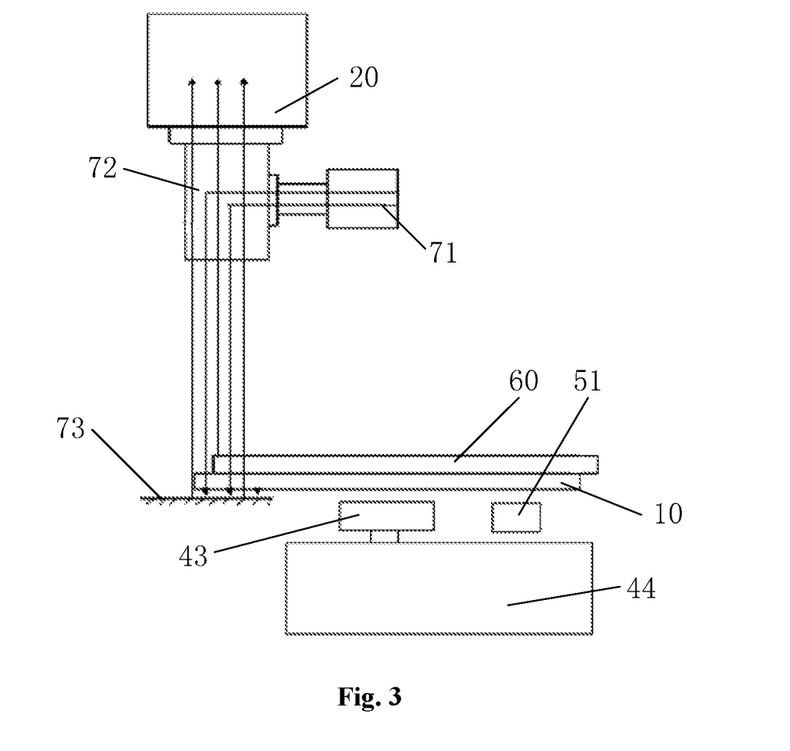
FIG. 3 is a diagram showing an optical path in the reflective optical system in the wafer pre-alignment device in accordance with the first embodiment of the present invention.
Figure 4:
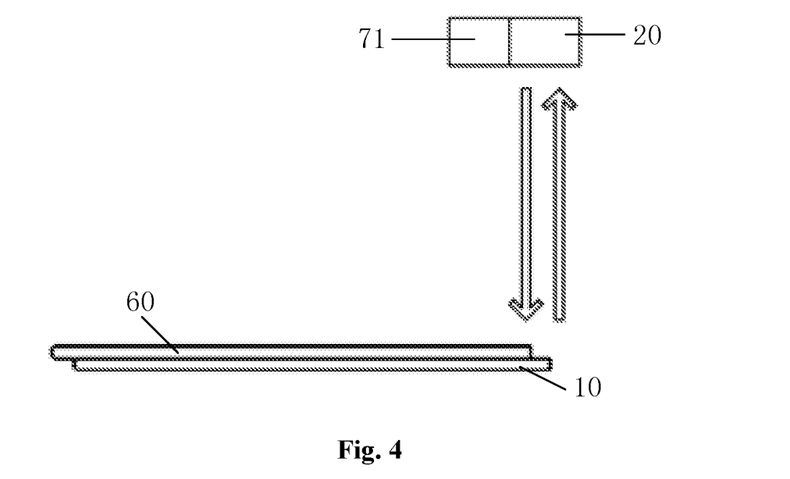
FIG. 4 is a schematic showing a reflective pre-alignment approach performed by the wafer pre-alignment device in accordance with the first embodiment of the present invention.

Preferably, with reference to FIGS. 3 and 4, the CCD image sensor 20 is disposed together with the light source 71 on the same side of a glass substrate 10. In other words, a reflective pre-alignment approach is used. In particular, with emphasized reference to FIG. 3, a light beam emanated from the light source 71 is reflected by the lens assembly 72 so that it is vertically incident on the wafer 60 and is thereby reflected onto the CCD image sensor 20.

Preferably, with emphasized reference to FIG. 2 in conjunction with FIG. 1, in case of the wafer 60 being implemented as, for example, a TSV wafer, the reflective pre-alignment by the reflective optical system 70 may specifically include: placing the wafer 60 on the circular chuck 41; activating the circular chuck 41 so that the wafer 60 is vacuum-retained thereon; the light source 71 producing a light beam which passes through the lens assembly 72 and is thereby incident on the surface of the wafer 60, thereby allowing detection of an edge of the wafer 60; the circular chuck 41 driving the wafer 60 to rotate by 360 degrees, concurrently with the light beam being reflected by a lens 73 onto the CCD image sensor 20; the CCD image sensor 20 collecting the light beam reflected from the wafer 60, deriving relevant data and calculating eccentricity; lowering the circular chuck 41 and transferring the wafer onto the half-moon-shaped chuck 51; the half-moon-shaped chuck 51 carrying the wafer 60 to move in accordance with the calculated eccentricity, i.e., by an amount that is equal to an amount of the calculated eccentricity, thereby achieving centering of the wafer, i.e., alignment of its center with the center of the circular chuck 41; and the circular chuck 41 further driving the wafer such that the notch of the wafer 60 is aligned with the light beam, thereby allowing orientation of the wafer. The reflective pre-alignment approach according to the present invention solves the problem of inaccurate wafer centering and orientation arising from inability of the light beam for alignment and detection to transmit through the wafer-bearing glass substrate 10 under the wafer due to absence of a notch therein which disables a clear image of the wafer notch to be captured by the CCD image sensor 20, as well as from inability of the captured data to allow the distinguishing of the wafer edge from an edge of the glass substrate 10 due to eccentricity of the wafer 60. With the reflective pre-alignment approach, the wafer edge at the notch can be clearly captured and thus identified due to the wafer having different reflection factors at the notch and at the remainder which lead to different information received by the CCD image sensor 20. As a result, the wafer edge can be always distinguished from the edge of the glass substrate 10, even when there is eccentricity, allowing the centering and orientation of the wafer.

In addition, with continued reference to FIG. 3, a certain degree of scattering of the light beam produced by the light source 71 occurs at the surface of the wafer 60. Preferably, under the circular chuck 41, a lens 73 is arranged at a position corresponding to the CCD image sensor 20. By arranging the lens 73, the impact of the scattering can be reduced and an intensified light beam is reflected from the surface of the wafer 60. This enables a clearer edge image of the wafer 60 at the CCD image sensor 20 which facilitates subsequent image processing.

Preferably, the CCD image sensor 20 assumes the form of a one-dimensional linear array of 1024 pixels, an extend line of which passes through the center of the circular chuck 41. The linear-array CCD image sensor 20 is capable of, during the rotation of the wafer 60 with the circular chuck 41, capturing images at a constant rate, and the captured one-dimensional images can be processed by software into a set of two-dimensional images. This solves the problems of obtainment of excessive wafer information, slow image processing and inefficient wafer edge and notch identification arising from the use of area-array CCD image sensors.

Figure 5:
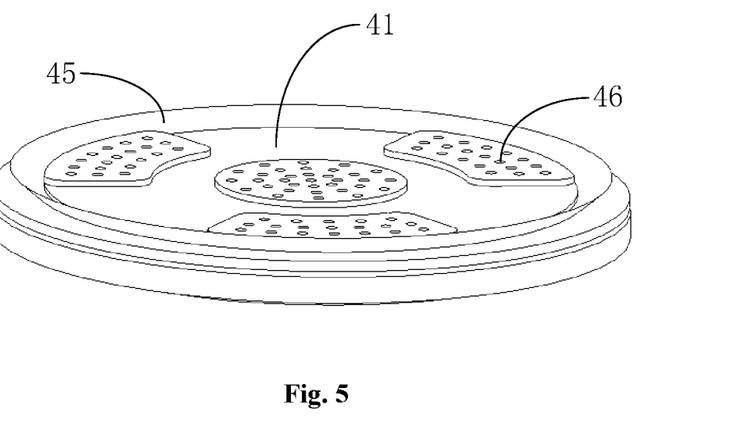
FIG. 5 is a schematic illustration of a circular chuck in the wafer pre-alignment device.
Figure 6:
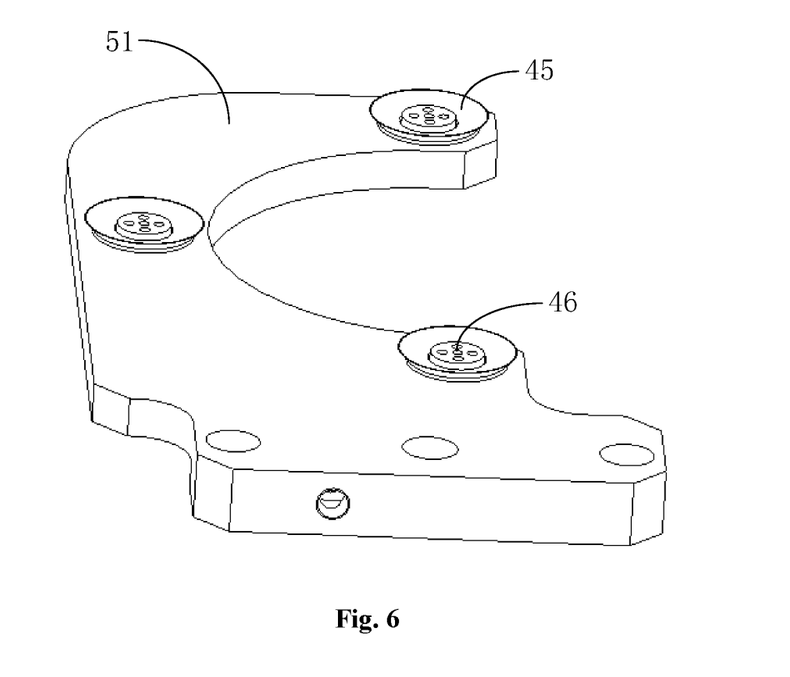
FIG. 6 is a schematic illustration of a half-moon-shaped chuck in the wafer pre-alignment device.
Figure 7:
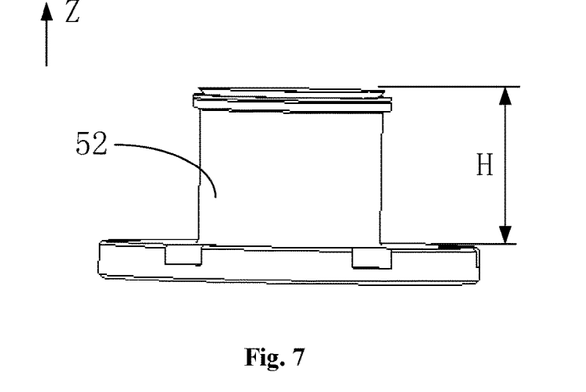
FIG. 7 is a schematic illustration of a base for the circular chuck in the wafer pre-alignment device.

Preferably, with emphasized reference to FIGS. 5 and 6, around the perimeter of each suction port of the circular chuck 41 and the half-moon-shaped chuck 51 is disposed a flexible material 45 which is preferably selected to be rubber. Disposing the rubber around the perimeter of each suction port of the circular chuck 41 and the half-moon-shaped chuck 51 allows the warpage of a warped wafer to be compensated for by deformation of the rubber and addresses the difficulty of retaining a warped wafer encountered in the use of conventional pre-alignment devices. With additional reference to FIG. 7, according to the present invention, the vertical stroke of the circular chuck 41 and the height H (FIG. 7) of the base 52 can be increased to adapt for the warpage-caused dimensional increase of the warped wafer in the direction of the normal to its surface (i.e., the direction perpendicular to its surface).

Preferably, with continued reference to FIGS. 5 and 6, each of the circular chuck 41 and the half-moon-shaped chuck 51 are multi-hole chuck, i.e., having multiple suction holes in each of the suction ports of the circular chuck 41 and the half-moon-shaped chuck 51. In comparison to retention by single-hole chucks, such multi-hole chucks can provide the wafer with more evenly-distributed suction forces and thereby reduce suction-caused surface deformations. As a result, increased protection from damage is achieved for ultra-thin wafers and TAIKO wafers.

Embodiment 2

Figure 8:
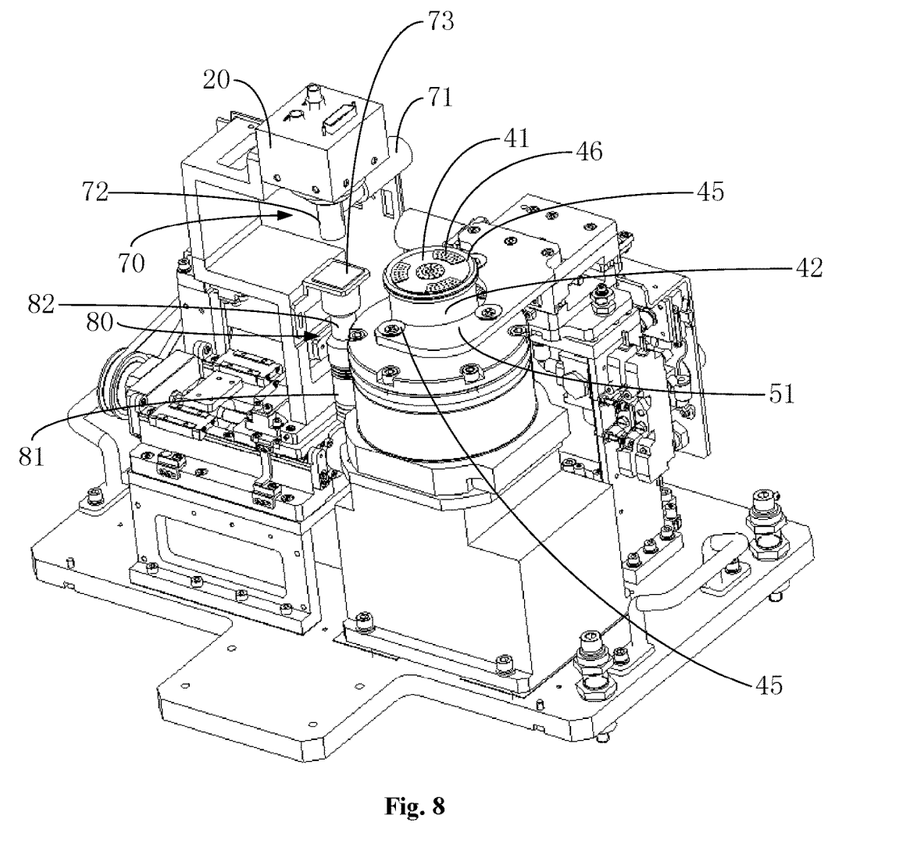
FIG. 8 is a schematic illustration of a wafer pre-alignment device in accordance with a second embodiment of the present invention.

Preferably, while the reflective optical system 70 can be used to handle regular wafers and wafers from various processes other than TSV processes, in these applications, the system has to process a tremendous amount of data with low efficiency. Accordingly, in this embodiment, in addition to the reflective optical system 70 dedicated to the handling of TSV wafers, the present invention provides a wafer pre-alignment device further incorporating a catadioptric optical system 80 for dealing with wafers other than TSV wafers. Therefore, this wafer pre-alignment device is adapted to the pre-alignment of wafers from various processes. Specifically, as shown in FIG. 8, the wafer pre-alignment device according to this embodiment differs from that of Embodiment 1 in further having the catadioptric optical system 80. The catadioptric optical system 80 includes a light source 81 and a lens assembly 82. The light source 81 produces green light. The light source 81 is disposed on a side of the wafer opposite the side where the CCD image sensor 20 is arranged. A light beam emanated from the light source 81 passes through the lens assembly 82 and is incident on the surface of the wafer. After that, the light beam transmits through the lens 73 and is incident on the linear-array CCD image sensor 20.

By switching between the reflective optical system 70 and the catadioptric optical system 80, the pre-alignment device according to this embodiment is suited to the pre-alignment and handling of wafers from various processes.

Specifically, when handling a TSV wafer, the light source 71 (producing red light) is activated. The produced red light is then incident on the lens 73 which is transparent to green light but not to red light. Therefore, the light is reflected back, thus entailing a reflective pre-alignment approach.

When another wafer which is not a TSV wafer is handled, the light source 81 (producing green light) is switched on. When the produced green light is incident on the lens 73 which allows the transmission of green light, it travels through the lens, thereby entailing a transmissive pre-alignment approach. Use of the lens that is transmissive to green light but is non-transmissive to red light makes it possible for the pre-alignment device to use both the two optical systems of different types. In addition, by on-line switching between the two optical systems, the pre-alignment device is able to deal with wafers from various processes with maximized re-alignment efficiency.

The wafer pre-alignment device according to the present invention can be used to align wafers from various processes, including not only regular standard wafers, but also warped wafers, TSV wafers, ultra-thin wafers, Taiko wafers and the like by itself without needing any additional pre-alignment unit. This results in a reduction in equipment cost and an expanded application scope.

In summary, the present invention enables wafers from a variety of processes to be handled by a single wafer pre-alignment device with the capabilities of compensating for the warpage of warped wafers by a flexible material 45 arranged around each suction port of the circular chuck 41 and the half-moon-shaped chuck 51, addressing the difficulties in centering and orientation by obtaining wafer edge information using a reflective pre-alignment approach which prevents the linear-array CCD image sensor 20 from capturing unclear wafer notch image, and ensuring ultra-thin wafers and Taiko wafers to be retained by evenly distributed suction forces through the use of multi-hole chucks instead of single-hole ones.

Embodiment 3

Figure 9:
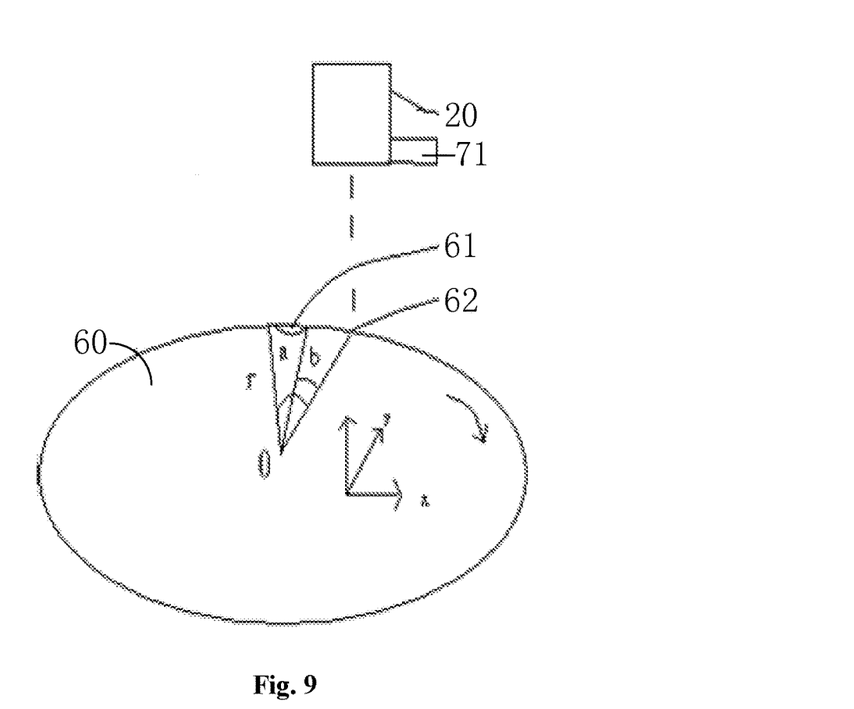
FIG. 9 shows the position of a CCD image sensor and the position of a TSV wafer prior to detailed scanning of a TSV wafer pre-alignment method in accordance with a third embodiment of the present invention.
Figure 10:
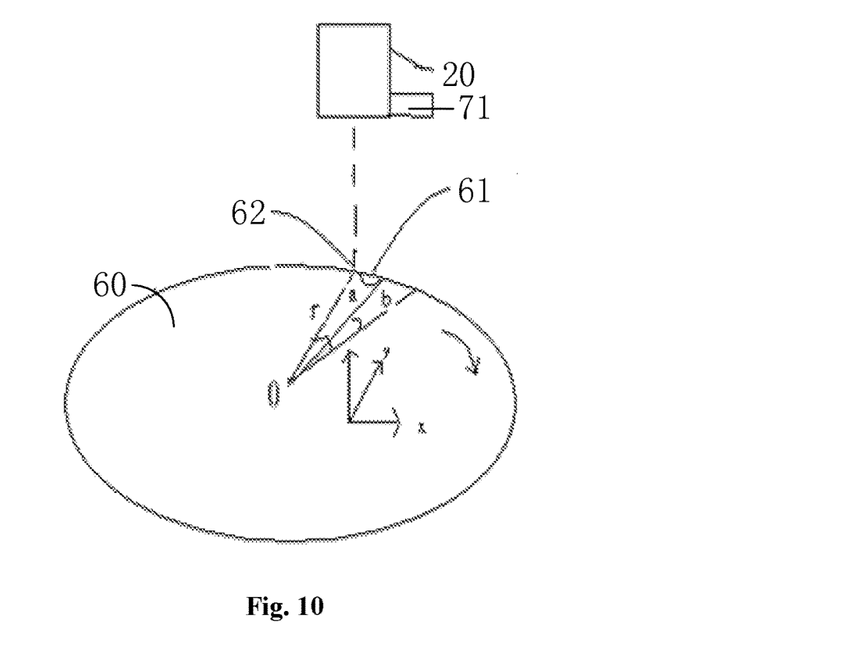
FIG. 10 shows the position of the CCD image sensor and the position of the TSV wafer after the detailed scanning of the TSV wafer pre-alignment method in accordance with the third embodiment of the present invention.
Figure 11:
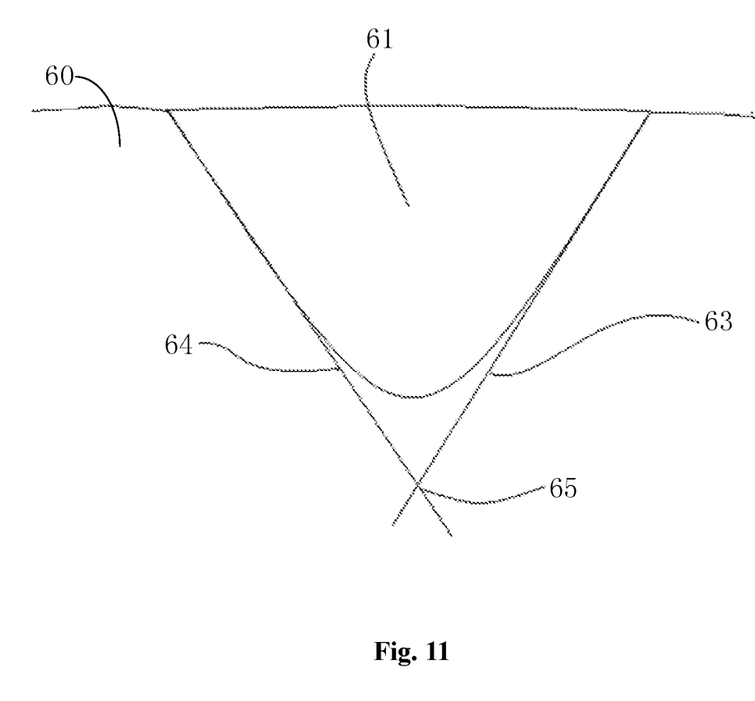
FIG. 11 is a schematic showing attributes of a notch in the TSV wafer pre-alignment method in accordance with the third embodiment of the present invention.
Figure 12:
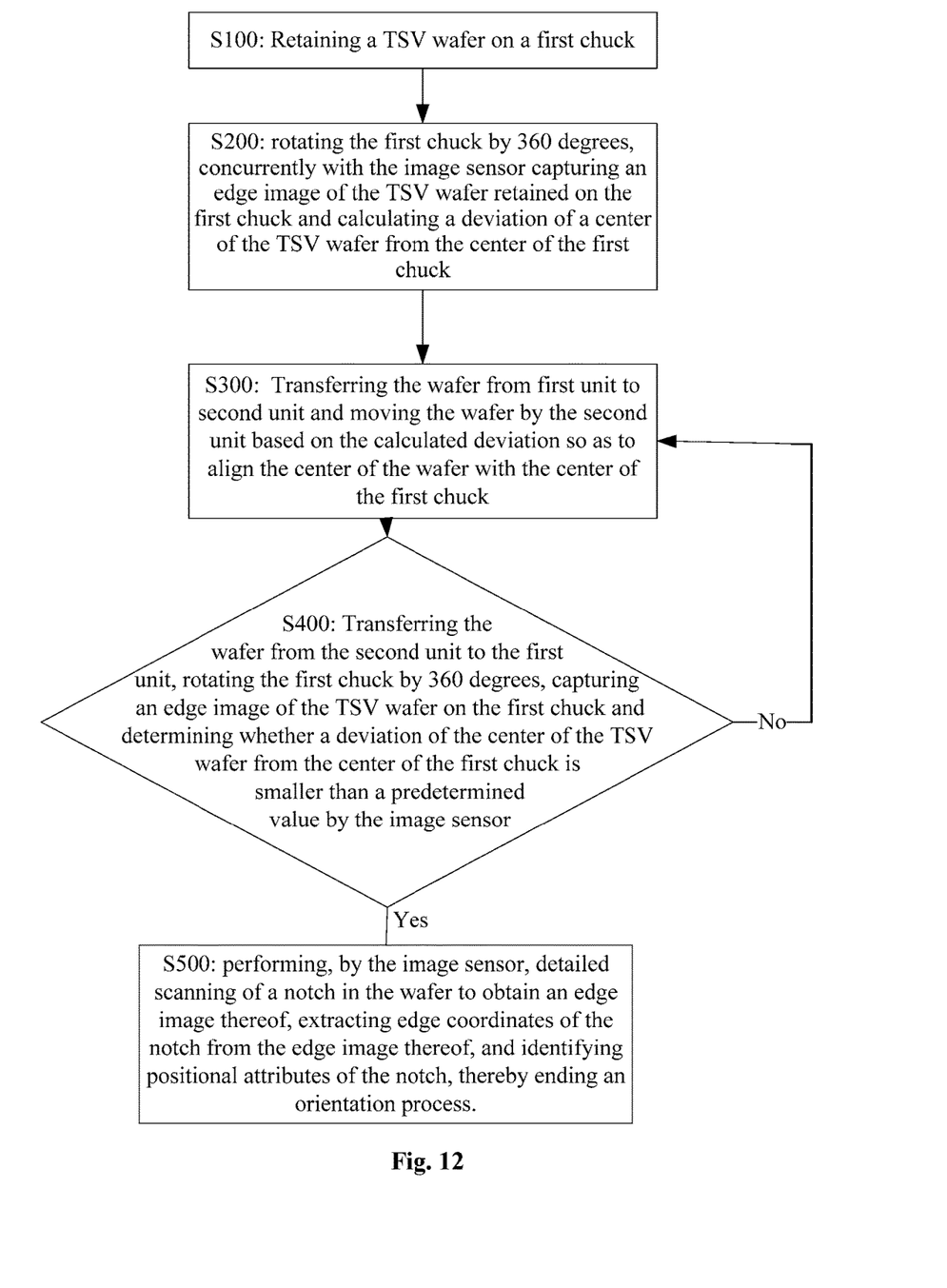
FIG. 12 is a flowchart showing the TSV wafer pre-alignment method in accordance with the third embodiment of the present invention.

With emphasized reference to FIG. 12, in conjunction with FIGS. 1 to 11, the present invention also provides a wafer pre-alignment method (in this embodiment, with the handling of a TSV wafer as an example) for use with the wafer pre-alignment device as defined above. The method includes the steps as follows:

In S100, with the wafer 60 being sucked on the circular chuck 41, a light beam from the light source 71 is incident on the edge of the wafer 60. With Reference to FIG. 9, the wafer 60 has a center O, a radius r and a notch 61 that is located counterclockwise with respect to a position under the CCD image sensor 20. The notch 61 intersects with the edge of the wafer 60 at two points, in which, the point closer to a center line of the CCD image sensor 20 is spaced from an intersection point 62 of the edge of the wafer 60 and the center line of the CCD image sensor 20 by an arc angle b which can be adjusted primarily based on a distance that the CCD image sensor 20 scans the notch 61. If a long distance is to be scanned, the angle b shall be increased; if a short distance is to be scanned, the angle b shall be decreased. The value of angle b determines the quality of images of the notch 61 captured by the sensor, which has a great impact on a subsequent image processing process. The notch 61 spans an arch c in the wafer 60.

In S200, the rotating motor 43 drives the circular chuck 41 to rotate by 360 degrees, concurrently with the CCD image sensor 20 capturing an edge image of the wafer 60 carried by the circular chuck 41 and calculating eccentricity between the wafer 60 and the circular chuck 41 using a centering algorithm.

Figure 13:
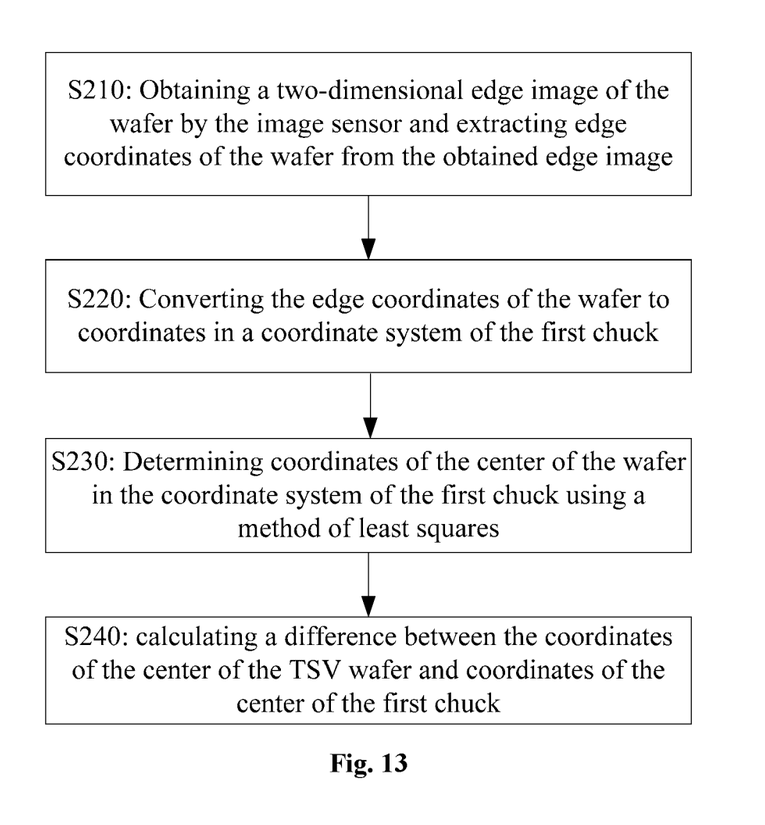
FIG. 13 is a flowchart showing step S200 in the TSV wafer pre-alignment method in accordance with the third embodiment of the present invention.

Preferably, as shown in FIG. 13, the centering algorithm includes the following steps:

In S210, the CCD image sensor 20 obtains a two-dimensional edge image of the wafer 60. Preferably, the CCD image sensor 20 is a linear-array sensor which captures one-dimensional images of the wafer edge, and the captured one-dimensional images are then combined into the two-dimensional image by software. Preferably, at least 2000 one-dimensional images are captured. The obtained wafer edge image is then converted into edge coordinates. Specifically, the conversion is accomplished by establishing a positional relationship between the CCD image sensor 20 and the wafer based on the wafer radius. In other words, as the distance of each pixel in the CCD image sensor 20 from the center of the wafer is known, the position of the wafer can be determined by processing a one-dimensional image captured by the CCD sensor. Similarly, the same can also be achieved based on the two-dimensional image combined from the 2000 one-dimensional images. The notch 61 has two sides (i.e., the first side 63 and the second side 64 in FIG. 11). Once the first side 63 and the second side 64 have been identified, the position of the notch 61 in image is determinable. Coordinates of the notch 61 are set in the same coordinate system as those of the circular chuck 41.

In S220, coordinates obtained from the edge image of the wafer 60 are converted to coordinates in the coordinate system of the circular chuck 41.

In S230, the coordinates of the center of the wafer 60 in the coordinate system of the first chuck is determined using a method of least squares.

In S240, a difference between the coordinates of the center of the wafer 60 and the coordinates of the center of the circular chuck 41 is determined.

Preferably, in step S200, a type of the wafer 60 is determined based on the two-dimensional edge image of the wafer 60, and an intensity of the light produced by the light source 71 is determined based on the type of the wafer 60. In particular, the present invention is adapted to capture edge images and notch images of wafers from different processes by irradiating the wafers with different types of light having different intensity variation schemes, reflection effects and scattering effects.

During the centering, a grayscale value of, or a number of non-zero points of a binarized form of, the edge image captured with a maintained light intensity during the 360-degree rotation of the wafer 60 can serve as criteria for determining the type of the wafer 60. Specifically, wafers from different processes lead to varying quality of images captured under the same irradiation conditions, based on which the types of the wafers can be determined with the aid of an image processing technique.

Specifically, the determination may involve:
1) capturing images of wafers of different types with the same light intensity;
2) binarizing the images with the same binarization threshold using a binarization function such that each of the images is represented by black points and white points;
3) for each wafer, counting the number of white points;
4) considering the numbers of white points of the wafers from different processes lie in different white point number ranges due to the great differences between them;
5) determining the type of each wafer according to which range the corresponding number of white points is in.

For each type of wafer 60, the intensity of the used light is tuned to the most desirable value at which complete, clear images of the notch 61 can be obtained which result in easier image processing, improved identification of notch and edge attributes, and increased pre-alignment efficiency. Based on the aforementioned criteria, each process may be provided with a separate light intensity.

In S300, the lifting motor 44 drives the circular chuck 41 to move downward, followed by transferring the wafer 60 onto the half-moon-shaped chuck 51. The half-moon-shaped chuck 51 moves the wafer 60 according to the calculated eccentricity, so that the center of the wafer 60 is aligned with the center of the circular chuck 41.

In S400, the lifting motor 44 drives the circular chuck 41 to move upward, and the wafer 60 is transferred back onto the circular chuck 41. Steps S200 to S300 are repeated until the centering process is completed when the CCD image sensor 20 has detected that the eccentricity between the wafer 60 and the circular chuck 41 is within a permissible range.

It is noted that during the transfers of the wafer between the circular chuck 41 and the half-moon-shaped chuck 51, the wafer 60 is always firmly retained by the circular chuck 41 with errors occurring that are negligible compared to the eccentricity.

In S500, the CCD image sensor 20 performs detailed scanning of the notch 61 in the wafer 60 to obtain a two-dimensional edge image of the notch 61 in the wafer 60. Edge coordinates of the notch 61 are extracted from the edge image of the notch 61, and positional attributes of the notch 61 are identified. This results in the completion of the orientation process.

Preferably, with emphasized reference to FIG. 11, the first side 63 and the second side 64 serve as characterizing attributes of the notch 61 in identifying the notch in fitted two-dimensional images. A direction from an intersection point 65 of the two sides to the center O of the wafer is defined as a direction of the notch 61 and places constraints on slops and intercepts of the sides.

Figure 14:
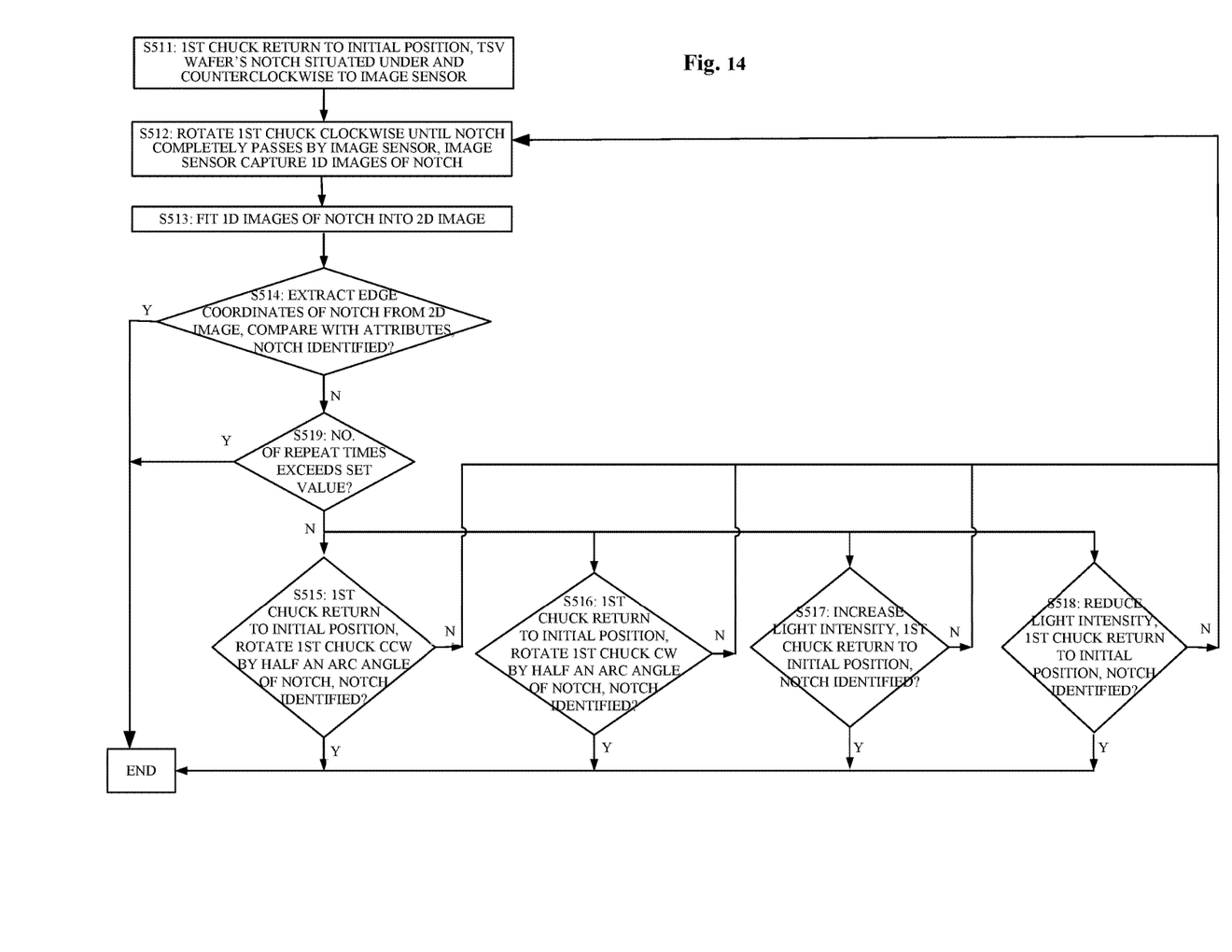
FIG. 14 is a flowchart showing step S500 in the TSV wafer pre-alignment method in accordance with the third embodiment of the present invention.

Preferably, with emphasized reference to FIG. 14, in step S500, the detailed scanning further includes the following steps:

In S511, the circular chuck 41 is caused to return to the original position, with the notch 61 of the wafer 60 situated under and counterclockwise to the CCD image sensor 20.

In S512, the circular chuck 41 is rotated clockwise by an angle a which is equal to the sum of angles b and c, i.e., a=b+c. In other words, the notch 61 of the wafer 60 is caused to completely pass by the CCD image sensor 20. During the rotation, the CCD image sensor 20 captures one-dimensional images of the notch. Preferably, the number of captured one-dimensional images is greater than or equal to 2000.

In S513, the one-dimensional images of the notch 61 are fitted together into a two-dimensional image.

In S514, edge coordinates of the notch 61 are extracted from the two-dimensional image and are compared to the attributes of the notch. If the notch 61 is identified, the orientation process is completed; otherwise, if the notch 61 is not identified, a counter is activated and steps S515, S516, S517 and S518 are sequentially repeated until a number of times of repetition set in the counter has been reached.

In S515, if the notch 61 is not identified yet, it is considered that there may be a counterclockwise deviation in the position of the notch. That is, it is likely for the notch to be situated more clockwise than desired. Accordingly, a rotating shaft of the rotating motor 43 is caused to return to the original position (in the direction R) and then drives the circular chuck 41 to rotate counterclockwise by an angle that is half an angle of the arc c of the notch (without the light intensity being changed), followed by repeating steps S512 to S514. If the notch 61 is identified, the orientation process is completed.

In S516, if the notch 61 is still not yet identified, it is considered that there may be a clockwise deviation in the position of the notch. That is, it is likely for the notch to be situated more counterclockwise than desired. Accordingly, the rotating shaft of the rotating motor 43 is caused to return to the original position (in the direction R) and then drives the circular chuck 41 to rotate clockwise by an angle that is half the angle of the arc c of the notch (without the light intensity being changed), followed by repeating steps S512 to S514. If the notch 61 is identified, the orientation process is completed.

In S517, if the notch 61 is still not yet identified, it is considered that the intensity of light from a point light source for the CCD sensor may be insufficient. Accordingly, the intensity of the light is increased and the circular chuck 41 is caused to return to the original position, followed by repeating steps S512 to S514. If the notch 61 is identified, the orientation process is completed.

In S518, if the notch 61 is still not yet identified, it is considered that the intensity of light from the point light source for the CCD sensor may be excessive. Accordingly, the intensity of the light is reduced and the circular chuck 41 is caused to return to the original position, followed by repeating steps S512 to S514. If the notch 61 is identified, the orientation process is completed.

Preferably, the method further includes step S519, in which if the notch 61 is still not yet identified, a check is performed to determine whether the number of times steps S515, S516, S517 and S518 have been repeated exceeds the set value. If the number of times the steps have been repeated does not exceed the set value, the steps are repeated until the value set in the counter is reached; otherwise, the orientation process and hence the pre-alignment is ended.

The wafer pre-alignment method according to the present invention achieves automated pre-alignment of the wafer 60 with an improved pre-alignment accuracy.

In summary, the present invention provides a wafer pre-alignment device and a method therefor. The device includes a light source 10, an image sensor (preferably a CCD image sensor 20), first unit 40 and second unit 50. The first unit 40 is configured to drive a wafer to rotate or move vertically, and the second unit 50 is configured to drive the wafer to translate. The wafer 60 is sucked on the first unit 40. The CCD image sensor 20 is configured to capture a light beam that is produced by the light source 71 and has been reflected by the wafer 60 as an optical signal, based on which, the first unit 40 and the second unit 50 effect adjustments for centering and orientation of the wafer 60. The present invention enables compensation for eccentricity and deviations of the wafer 60 based on the optical signal obtained by the image sensor, thereby achieving an increased pre-alignment accuracy for the wafer 60, higher operational efficiency and automated processing.

It is apparent that those skilled in the art can make various changes and modifications without departing from the spirit and scope of the present invention. It is thus intended that all such changes and modifications fall within the scope of the invention as defined by the appended claims and their equivalents.

What is claimed is:

1. A wafer pre-alignment device, comprising:
a first unit configured to drive a wafer to rotate or move upward or downward, the first unit comprising a first chuck for retaining the wafer;
a second unit configured to drive the wafer to translate relative to the first chuck;
a position detector comprising a light source, an image sensor disposed above the first chuck, and a lens disposed under the first chuck, wherein a light beam from the light source passes through the wafer, the first chuck and the lens and thereby provides information indicating a position of the wafer relative to the first chuck on to the image sensor,
wherein the first unit and the second unit are configured to adjust the position of the wafer relative to the first chuck based on the information obtained by the image sensor,
wherein the first unit further comprises: a rotating motor configured to drive the first chuck to rotate; and a lifting motor configured to drive the first chuck to move upward or downward, and
wherein the second unit comprises: a second chuck disposed lateral to the first chuck, wherein the lifting motor is configured to transfer the wafer between the first chuck and the second chuck; and a translating motor configured to drive the second chuck and the wafer to translate so as to adjust a radial position of the wafer relative to the first chuck.

2. The wafer pre-alignment device of claim 1, wherein the information comprises a deviation of a center of the wafer from a center of the first chuck, and wherein the first unit and the second unit are configured to adjust a radial position of the wafer relative to the first chuck based on the deviation.

3. The wafer pre-alignment device of claim 1, wherein each of the first chuck and the second chuck comprises a plurality of suction holes.

4. The wafer pre-alignment device of claim 1, wherein the image sensor comprises a plurality of CCDs arranged in a one-dimensional linear array, an extended line of the one-dimensional linear array passes through a center of the first chuck.

5. The wafer pre-alignment device of claim 1, wherein the position detector comprises a reflective optical system and/or a catadioptric optical system.

6. The wafer pre-alignment device of claim 5, wherein the reflective optical system comprises the light source, a first lens assembly, the image sensor and the lens, the light source serving as a first light source for producing a light beam having a first wavelength, the lens implemented as a reflective lens for reflecting the light beam having the first wavelength, the first lens assembly disposed above the first chuck and under the image sensor and configured to direct the light beam having the first wavelength on the wafer and the reflective lens and the light beam is then reflected onto the image sensor.

7. The wafer pre-alignment device of claim 5, wherein the catadioptric optical system comprises the light source, a second lens assembly, the image sensor and the lens, the light source serving as a second light source for producing a light beam having a second wavelength, the lens implemented as a transmissive lens allowing the transmission of the light beam having the second wavelength, the second lens assembly disposed under the first chuck and configured to cause the light beam having the second wavelength to transmit through the wafer and the transmissive lens and then reach the image sensor.

8. The wafer pre-alignment device of claim 5, wherein the lens is a filtering lens configured to reflect a light beam having a first wavelength and allow transmission of a light beam having a second wavelength.

9. The wafer pre-alignment device of claim 5, wherein: the wafer is a TSV wafer with a notch on an edge thereof, a warped wafer, an ultra-thin wafer or a Taiko wafer; the catadioptric optical system is configured to obtain the information indicating the position of the ultra-thin wafer or the Taiko wafer relative to the first chuck; and the reflective optical system is configured to obtain the information indicating the position of the TSV wafer relative to the first chuck.

10. The wafer pre-alignment device of claim 9, wherein the information further comprises a position of the notch with respect to the TSV wafer and a position of the notch with respect to the first chuck, and wherein the first unit is further configured to adjust a circumferential position of the TSV wafer relative to the first chuck based on the information.

11. A method for pre-aligning the TSV wafer using the wafer pre-alignment device as defined in claim 10, comprising the steps of:
a) retaining the TSV wafer on the first chuck by suction and irradiating the edge of the TSV wafer with a light beam produced by a first light source;
b) rotating the first chuck by 360 degrees, concurrently with the image sensor capturing an edge image of the TSV wafer retained on the first chuck and calculating a deviation of a center of the TSV wafer from the center of the first chuck;
c) transferring the TSV wafer from the first unit to the second unit and moving the TSV wafer by the second unit based on the calculated deviation so as to align the center of the TSV wafer with the center of the first chuck;
d) transferring the TSV wafer from the second unit back to the first unit, rotating the first chuck by 360 degrees, capturing an edge image of the TSV wafer on the first chuck and determining whether a deviation of the center of the TSV wafer from the center of the first chuck is smaller than a predetermined value by the image sensor, if yes, proceeding to step e and, if not, looping back to step c; and
e) performing, by the image sensor, detailed scanning of the notch in the TSV wafer to obtain an edge image of the notch, extracting edge coordinates of the notch from the edge image of the notch, and identifying positional attributes of the notch, thereby ending an orientation process.

12. The method of claim 11, wherein the calculating the deviation of the center of the TSV wafer from the center of the first chuck comprises:
b1) obtaining a two-dimensional edge image of the TSV wafer by the image sensor and extracting edge coordinates of the TSV wafer from the obtained two-dimensional edge image of the TSV wafer;
b2) converting the edge coordinates of the TSV wafer to coordinates in a coordinate system of the first chuck;
b3) determining coordinates of the center of the TSV wafer in the coordinate system of the first chuck using a method of least squares; and
b4) calculating a difference between the coordinates of the center of the TSV wafer and coordinates of the center of the first chuck.

13. The method of claim 12, wherein in step b1, the image sensor is a linear-array CCD image sensor which captures one-dimensional edge images of the TSV wafer, and the captured one-dimensional edge images are combined by software into the two-dimensional edge image of the TSV wafer.

14. The method of claim 11, wherein step b further comprises: determining a type of the TSV wafer based on the edge image of the TSV wafer and determining a light intensity for the first light source based on the determined type of the TSV wafer.

15. The method of claim 11, wherein in step e, the detailed scanning comprises the steps of:
e1) causing the first chuck to return to an original position with the notch in the TSV wafer situated under and counterclockwise to the image sensor;
e2) rotating the first chuck clockwise by an angle such that the notch in the TSV wafer completely passes by the image sensor, with the image sensor capturing one-dimensional images of the notch;
e3) fitting the one-dimensional images of the notch together into a two-dimensional image;
e4) extracting edge coordinates of the notch from the two-dimensional image and comparing the edge coordinates of the notch with the attributes of the notch, if the notch is identified, ending the orientation process and, if the notch is not identified, activating a counter and sequentially proceeding with one of step e5, step e6, step e7 and step e8 according to a number of repeated times indicated by the counter;

e5) causing the first chuck to return to the original position, rotating the first chuck counterclockwise by an angle that is half an arc angle of the notch, repeating step e2 to step e4 and, if the notch is identified, ending the orientation process;
e6) causing the first chuck to return to the original position, rotating the first chuck clockwise by an angle that is half the arc angle of the notch, repeating step e2 to step e4 and, if the notch is identified, ending the orientation process;
e7) increasing a light intensity, causing the first chuck to return to the original position, repeating step e2 to step e4 and, if the notch is identified, ending the orientation process; and
e8) reducing the light intensity, causing the first chuck to return to the original position, repeating step e2 to step e4 and, if the notch is identified, ending the orientation process.

16. The method of claim 15, further comprising:
e9) after step e4, checking the number of repeated times indicated by the counter, and if the number does not exceed a set value, sequentially proceeding with one of step e5, step e6, step e7 and step e8 and, if the number exceeds the set value, ending the orientation process and hence the pre-alignment.

* * * * *